(12) United States Patent
Klindworth

(10) Patent No.: US 6,535,048 B1
(45) Date of Patent: Mar. 18, 2003

(54) SECURE ASYNCHRONOUS CLOCK MULTIPLEXER

(75) Inventor: Andre Klindworth, San Jose, CA (US)

(73) Assignee: Infineon Technologies North America Corp., San Jose, CA (US)

( * ) Notice: Subject to any disclaimer, the term of this patent is extended or adjusted under 35 U.S.C. 154(b) by 0 days.

(21) Appl. No.: 09/499,879

(22) Filed: Feb. 8, 2000

(51) Int. Cl.[7] .................... H03K 17/62; H03K 17/76; H03K 17/693; H03K 17/735
(52) U.S. Cl. ............................... 327/407; 327/298
(58) Field of Search ................... 327/99, 256–258, 327/298, 407

(56) References Cited

U.S. PATENT DOCUMENTS

| | | | |
|---|---|---|---|
| 4,853,653 A | * 8/1989 | Maher | 331/49 |
| 5,289,050 A | 2/1994 | Ogasawara | 307/269 |
| 5,726,593 A | * 3/1998 | Ruuskanen | 327/99 |
| 6,275,546 B1 | * 8/2001 | Miller et al. | 375/354 |

FOREIGN PATENT DOCUMENTS

EP   0 969 350 A2   1/2000

* cited by examiner

*Primary Examiner*—Terry D. Cunningham
*Assistant Examiner*—Quan Tra
(74) *Attorney, Agent, or Firm*—Fish & Richardson P.C.

(57) ABSTRACT

A system and method for clock multiplexing. According to one implementation, a pair of two stage cross-coupled clock gating elements are controlled by a single asynchronous enable signal. On change of the enable signal, the previously selected clock gets disabled before the newly selected clock is enabled.

22 Claims, 4 Drawing Sheets

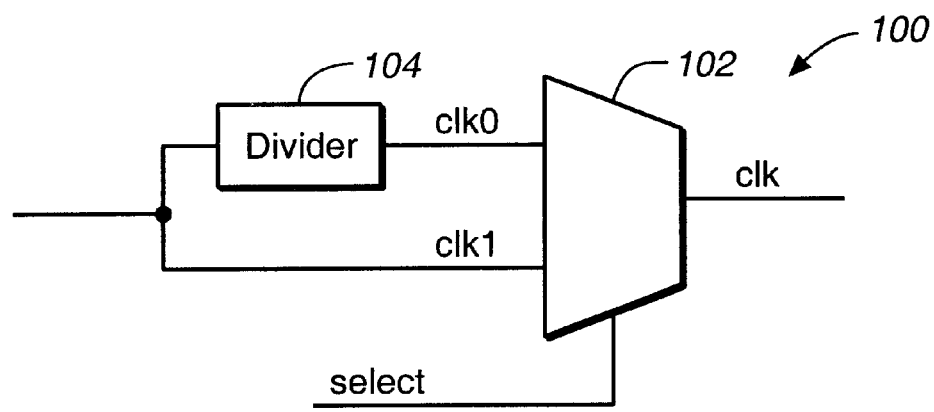
FIG._1
*(PRIOR ART)*
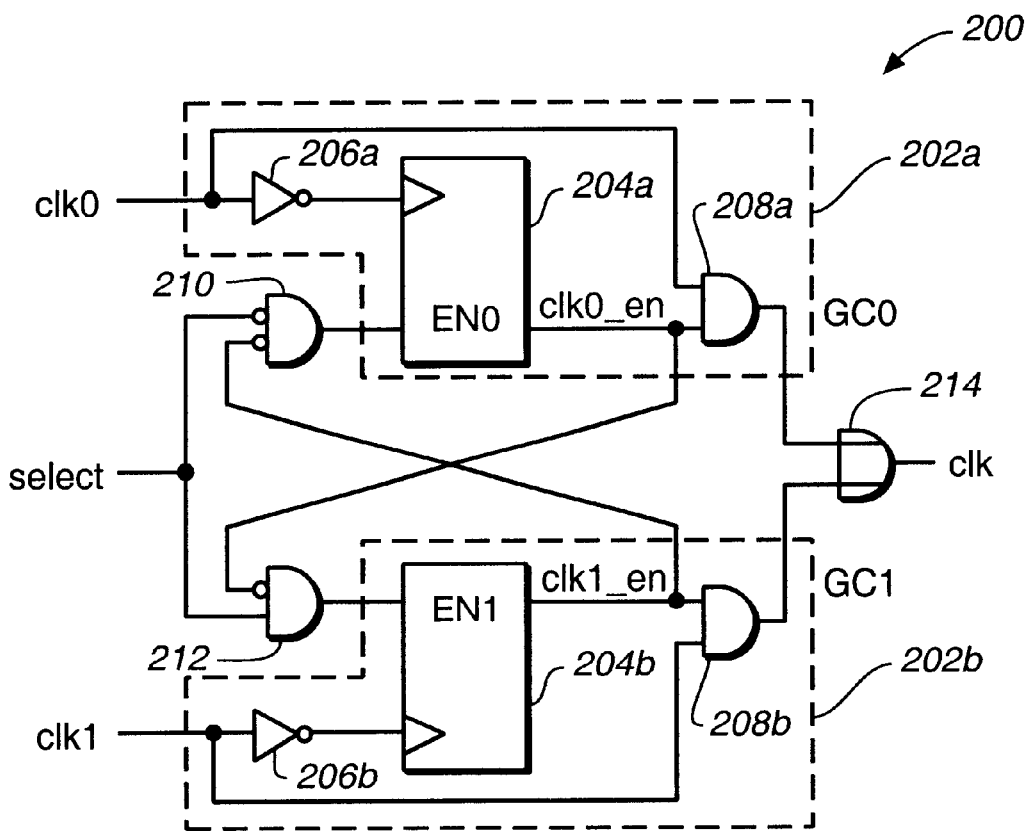
FIG._2
*(PRIOR ART)*

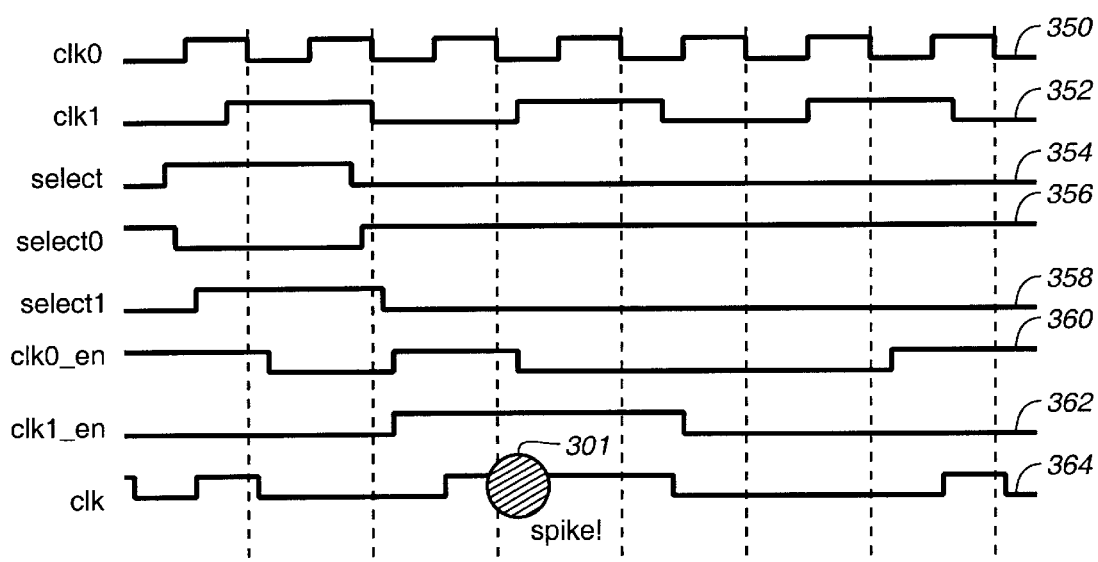
FIG._3
*(PRIOR ART)*

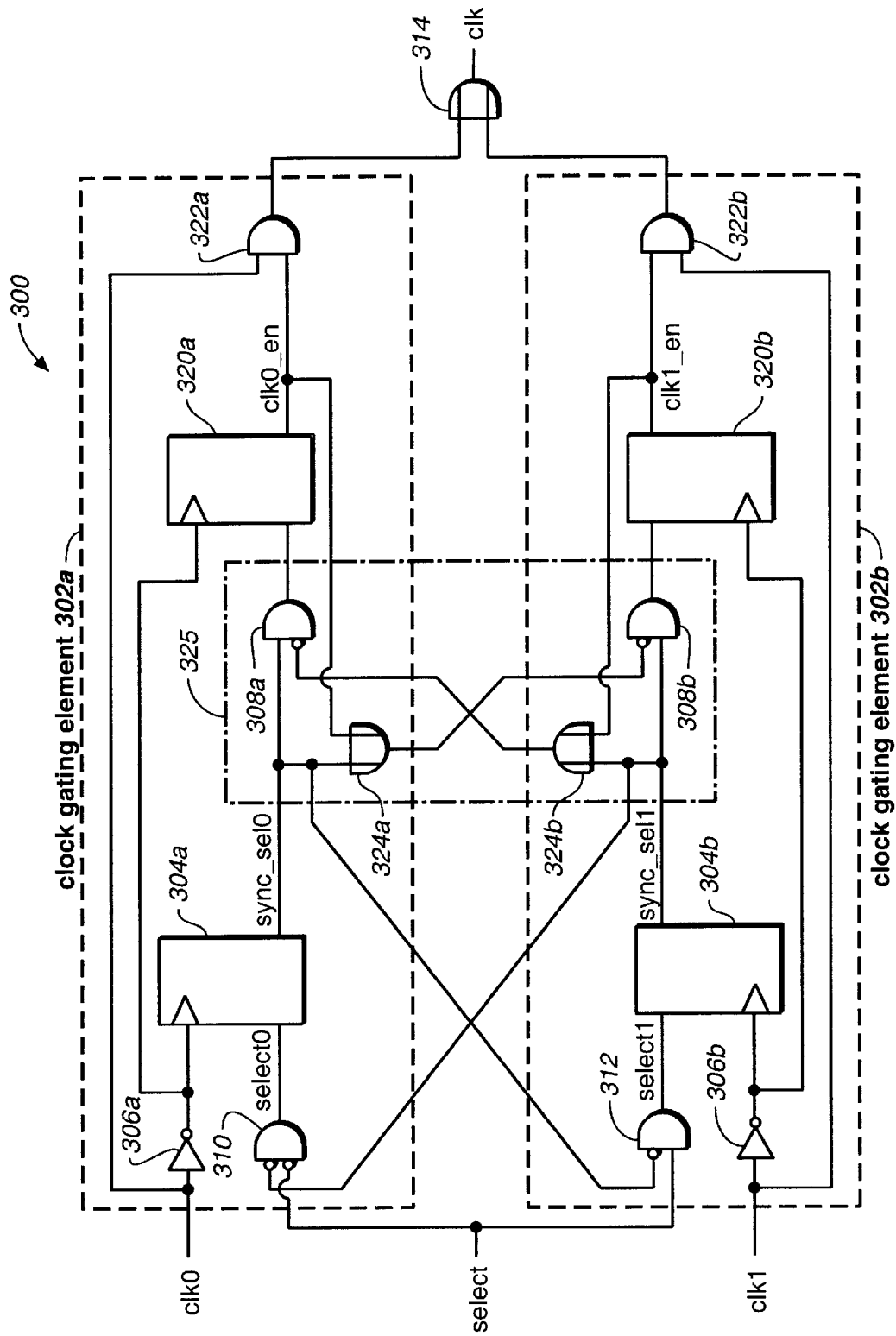
FIG._4

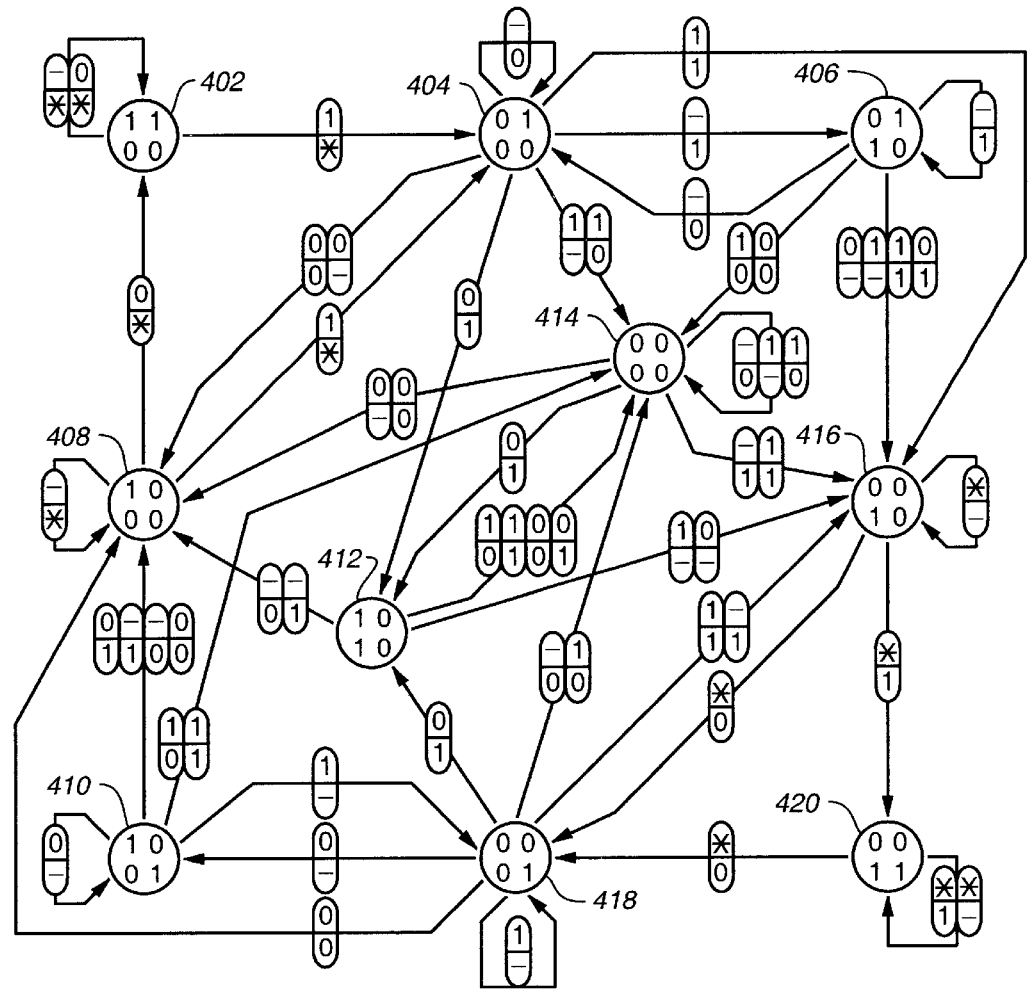
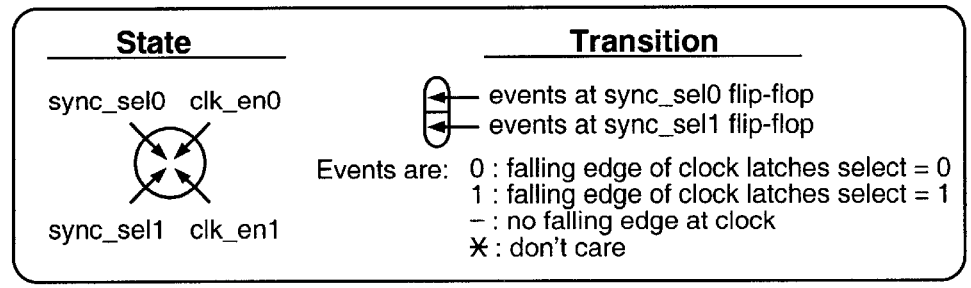
FIG._5

SECURE ASYNCHRONOUS CLOCK MULTIPLEXER

BACKGROUND OF THE INVENTION

1. Field of the Invention

The present invention relates to clock systems and, in particular, to an improved clock multiplexer.

2. Description of the Related Art

Many digital electronic devices require flexible clock management that allows switching between different clock sources and/or frequencies while the device remains operational. For example, power consumption can be optimized by using the maximum clock frequency only for processing of time critical tasks while a slower clock is applied to the system for other tasks. Typically, a clock multiplexer is employed to select between multiple clocks.

FIG. 1 illustrates such a clock multiplexer circuit. As shown in FIG. 1, a multiplexer 102 is provided which receives a CLK0 and a CLK1 input. The CLK0 input is output from a clock divider 104. A select signal SELECT is used to select between CLK0 and CLK1.

Any implementation of a clock multiplexer should guarantee that the duration of the multiplexed clock outputs remain intact (undistorted) and that the multiplexed clock is spike free. This is accomplished relatively easily if the select signal SELECT is synchronous to both source clocks. In FIG. 1, the two alternate clocks are synchronous to one another, so synchronizing the select signal is relatively straightforward. However, if the two alternate clocks are asynchronous to one another, a simple combinatorial multiplexer, as shown in FIG. 1, no longer generates a spike-free undistorted clock. But even in the case where both clocks are synchronous, the potential variations in the intrinsic and interconnect delays of the circuit components are much easier to deal with during physical implementation if no fixed relation is imposed on the arrival times of the clocks at the multiplexer.

Turning now to FIG. 2, a diagram of an exemplary known clock multiplexer is shown. The clock multiplexer 200 receives clock inputs CLK0 and CLK1, and a select input SELECT. The clock multiplexer 200 includes a pair of cross coupled clock gating elements 202a, 202b. As shown, each gating element 202a, 202b includes a flip flop 204a, 204b, an AND gate 208a, 208b and an inverter 206a, 206b. Clock inputs CLK0, CLK1 are provided to the inverters 206a, 206b, respectively. The flip flops 204a, 204b receive enable signals EN0 and EN1, respectively, and output enable signals CLK0_EN and CLK1_EN, respectively. By control of the enable signals CLK0_EN, CLK1_EN, the input clocks CLK0, CLK1 are either passed through the AND gates 208a, 208b, respectively, or the outputs of the AND gates GC0, GC1, are forced to 0. The clock gating elements 202a, 202b are coupled by way of AND gates 210, 212 and output OR gate 214. The AND gate 210 has two inverting inputs; the AND gate 212 has a single inverting input. On change of the select signal, the previously selected clock is disabled before the newly selected clock is enabled.

In particular, the SELECT signal is inverted at the input of the AND gate 210, but not the AND gate 212, such that SELECT will be clocked through only one or the other of the clock gating elements. Further, the output CLK1_EN of the flip flop 204b is fed back to the inverting input of the AND gate 210. The output CLK0_EN of the flip flop 204a is fed back to the inverting input of the AND gate 212. Thus, the enable signal EN0 is output from the AND gate 210 when the SELECT is low and the previous CLK1_EN is also low or inactive. Similarly, the enable EN1 is clocked through the flip flop 204b when the SELECT signal is high and the previous CLK0_EN is also inactive. A known variation of the circuit of FIG. 2 is to employ a pair of cascaded flip flops in each gating element.

While the circuit of FIG. 2 is generally effective in producing a clean switched clock, relative care must be taken to ensure that the select signal SELECT does not change without a clock being enabled and when both clocks have a falling edge near the same time. In such cases, one flip flop might latch the old value of select while the other is already latching the new value. This can result in both clocks being simultaneously enabled. For example, FIG. 3 is a timing diagram of the circuit of FIG. 2. Illustrated are the CLK0 waveform 350, CLK1 waveform 352, SELECT waveform 354, SELECT0 waveform 356, SELECT1 waveform 358, CLK0_EN waveform 360, CLK1_EN waveform 362, and CLK waveform 364. As shown, the CLK waveform 364 has a spike 301 when both clocks CLK0_EN and CLK1_EN are enabled.

SUMMARY OF THE INVENTION

These and other drawbacks in the prior art are overcome in large part by a system and method for clock multiplexing according to the present invention. According to one implementation, a pair of two-stage cross-coupled clock gating elements are controlled by a single asynchronous enable signal. On change of the enable signal, the previously selected clock always gets disabled before the newly selected clock is enabled.

BRIEF DESCRIPTION OF THE DRAWINGS

A better understanding of the invention is obtained when the following detailed description is considered in conjunction with the following drawings in which:

FIG. 1 is a diagram of a clock multiplexer according to the prior art;

FIG. 2 is a diagram illustrating a known clock multiplexer;

FIG. 3 is a timing diagram of the clock multiplexer of FIG. 2;

FIG. 4 is a diagram illustrating a clock multiplexer according to an implementation of the invention; and FIG. 5 is a state diagram of the clock multiplexer of FIG. 4.

DETAILED DESCRIPTION OF THE INVENTION

FIGS. 4–5 illustrate an improved system and method for clock multiplexing. A pair of cross-coupled clock gating elements are controlled by a single asynchronous enable signal. On change of the enable signal, the previously selected clock gets disabled before the newly selected clock is enabled.

As shown in FIG. 4, the clock multiplexer 300 includes a pair of two stage cross coupled gating elements 302a, 302b and a cross coupling circuit 325. The clock multiplexer 300 receives input clock signals CLK0, CLK1, and a select signal. SELECT, and outputs a clock, CLK. Each two stage gating element includes inverters 306a, 306b, a flip flop 304a, 304b, a flip flop 320a, 320b, and AND gates 308a, 308b, and 322a, 322b, respectively. The outputs of the AND gates 322a, 322b are provided to OR gate 314. The gating element 302a receives a select signal SELECT0, derived from the SELECT signal by way of AND gate 310; the gating element 302b receives a select signal SELECT1, derived from the SELECT by way of AND gate 312. The AND gate 310 has two inverting inputs; the AND gate 312 has a single inverting input. Thus, the AND gate 310 receives an inverted SELECT and an inverted SYNC_SEL1 as inputs. The AND gate 312 receives SELECT and inverted SYNC_SEL0 as inputs.

Further, each gating element 302a, 302b is cross coupled by way of the cross coupling circuit 325, i.e., OR gates 324a, 324b and AND gates 308a, 308b. The OR gates 324a, 324b receive as inputs SYNC_SEL0, SYNC_SEL1 and CLK0_EN and CLK1_EN, from the gating elements 302a, 302b, respectively. The SYNC_SELx signals are provided from the outputs of the flip flops 304a, 304b, respectively; the CLKx_EN signals are provided from the outputs of the flip flops 320a, 320b, to AND gates 322a, 322b, respectively. The additional stage defines a state that indicates which select signal each clock gating element sees for its next transition. A state in which both CLK0_EN and CLK1_EN are both 1 (i.e., enabled) at the same time cannot be reached.

In particular, the outputs of the OR gates 324a, 324b are provided to inverting inputs of AND gates 308b, 308a, respectively. The OR gates 324a, 324b force the SYNC_SELx signal to 0 when either of the other SYNC_SELx or CLKx_EN is enabled. This ensures stability over the requisite clock transition.

Operation of the circuit of FIG. 4 is understood with reference to the state diagram of the clock multiplexer shown in FIG. 5. The SYNC_SEL0, CLK_EN0, SYNC_SEL1, and CLK_EN1 signals define the states (402–420) of the state machine. Transition events are latching of SELECT=0, latching of SELECT=1, no falling edge at clock, and don't care. As can be seen, the circuit of FIG. 4 functions to prevent a potential instability resulting from both CLK0_EN and CLK1_EN being simultaneously enabled. The states 402 (1100) and 404 (0011) are stable states, in that they are maintained so long as SELECT does not change.

State 1100: Once in state 402 (1100), the system can transition to either state 402 or 404.

If SELECT=0 is clocked into gating element 302a or no clock occurs at clock gating element 302a, the transition is to state 402: CLK0_EN clocks in the output of AND gate 308a (=1 by SYNC_SEL0=1 and SYNC_SEL1=CLK1_EN=0). SYNC_SEL0 clocks in the output of AND gate 310 (=1 by SELECT=0 and SYNC_SEL1=0). If a clock appears also at gating element 302b, CLK1_EN clocks in the output of AND gate 308b (=0 by SYNC_SEL1) and SYNC_SEL1 clocks in the output of AND gate 312 (=0 by SYNC_SEL0=1).

If SELECT=1 is clocked into gating element 302a, the transition is to state 404: CLK0_EN clocks in the output of AND gate 308a (=1 by SYNC_SEL0=1 and SYNC_SEL1=CLK1_EN=0). SYNC_SEL0 clocks in the output of AND gate 310 (=0 by SELECT=1). If gating element 302b is clocked, CLK1_EN clocks in the output of AND gate 308b (=0 by SYNC_SEL1=0) and SYNC_SEL1 clocks in the output of AND gate 312 (=0 by SYNC_SEL0=0).

State 0100: Once in state 404 (0100), the system can transition to either state 408, 406, 414, 412, 416, or 404.

If SELECT=0 is clocked into gating element 302a and 302b or if it is clocked into 302a only and no clock edge appears at 302b, the transition is to state 408: CLK0_EN clocks in the output of AND gate 308a (=0 by SYNC_SEL0=0) and SYNC_SEL0 clocks in the output of AND gate 310 (=1 by SELECT=0 and SYNC_SEL1=0). If a clock appears also at gating element 302b, CLK1_EN clocks in the output of AND gate 308b (=0 by SYNC_SEL1=0) and SYNC_SEL1 clocks in the output of AND gate 312 (=0 by SELECT=0).

If SELECT=1 and a clock appears only at gating element 302b, the transition is to state 406: SYNC_SEL0 and CLK0_EN remain unchanged since there's no clock for gating element 302a. CLK1_EN clocks in the output of AND gate 308b (=0 by SYNC_SEL1=0). SYNC_SEL1 clocks in the output of AND gate 312 (=1 by SYNC_SEL0=0 and SELECT=1).

If SELECT=1 and a clock appears at gating element 302a only, or if both gating elements are clocked with 302a clocking in SELECT=1 and 302b clocking in SELECT=0 (that is, the clock edges occur during a 0→1 or a 1→0 transition at SELECT), the transition is to state 414: CLK0_EN clocks in the output of AND gate 308a (=0 by SYNC_SEL0=0). SYNC_SEL0 clocks in the output of AND gate 310 (=0 by SELECT=1). CLK1_EN potentially clocks in the output of AND gate 308b (=0 by SYNC_SEL1) and SYNC_SEL1 potentially clocks in the output of AND gate 312 (=0 by SELECT=0).

If SELECT=1 and both gating elements are clocked at the same, the transition is to state 416: CLK0_EN clocks in the output of AND gate 308a (=0 by SYNC_SEL0=0) and SYNC_SEL0 clocks in the output of AND gate 310 (=0 by SELECT=1). CLK1_EN clocks in the output of AND gate 308b (=0 by SYNC_SEL1) and SYNC_SEL1 clocks in the output of AND gate 312 (=1 by SELECT=1 and SYNC_SEL0=0).

If both gating elements are clocked at the same time with 302a clocking in SELECT=0 and 302b clocking in SELECT=1 (that is, the clock edges occur during a 0→1 or a 1→0 transition at SELECT), the transition is to state 412: CLK0_EN clocks in the output of AND gate 308a (=0 by SYNC_SEL0=0). SYNC_SEL0 clocks in the output of AND gate 310 (=1 by SELECT=0 and SYNC_SEL1=0). CLK1_EN clocks in the output of AND gate 308b (=0 by SYNC_SEL1=0) and SYNC_SEL1 clocks in the output of AND gate 312 (=1 by SELECT=1 and SYNC_SEL0=0).

If no clock appears at gating element 302a and gating element 302b clocks in SELECT=0, the transition is to state 404: CLK0_EN and SYNC_SEL0 are not altered since there is no clock. CLK1_EN clocks in the output of AND gate 308b (=0 by CLK0_EN=1) and SYNC_SEL1 clocks in the output of AND gate 312 (=0 by SELECT=0).

State 0110: Once in state 406 (0110), the system can transition to either state 404, 414, 416, or 406.

If SELECT=0 is clocked into gating element 302b and no clock appears at gating element 302a, the transition is to state 404: SYNC_SEL0 and CLK0_EN remain unchanged since there's no clock for gating element 302a. CLK1_EN clocks in the output of AND gate 308b (=0 by CLK0_EN=1) and SYNC_SEL1 clocks in the output of AND gate 312 (=0 by SELECT=0).

If both gating elements are clocked at the same time with 302b clocking in SELECT=0 the transition is to state 414: CLK0_EN clocks in the output of AND gate 308a (=0 by SYNC_SEL0=0) and SYNC_SEL0 clocks in the output of AND gate 310 (=0 by SYNC_SEL1=1). CLK1_EN clocks in the output of AND gate 308b (=0 by CLK0_EN=1) and SYNC_SEL1 clocks in the output of AND gate 312 (=0 by SELECT=0).

If gating element 302a is clocked and gating element 302b is either not clocked or clocks in SELECT=1, the transition is to 416: CLK0_EN clocks in the output of AND gate 308a (=0 by SYNC_SEL0=0) and SYNC_SEL0 clocks in the output of AND gate 310 (=0 by SYNC_SEL1=1). CLK1_EN potentially clocks in the output of AND gate 308b (=0 by CLK0_EN=1) and SYNC_SEL1 potentially clocks in the output of AND gate 312 (=1 by SELECT=1 and SYNC_SEL0=0).

If no clock appears at clock gating element 302a and clock gating element 302b clocks in SELECT=1, the transition is to state 406: CLK0_EN and SYNC_SEL0 are not altered since there is no clock. CLK1_EN clocks in the output of AND gate 308b (=0 by CLK0_EN=1) and SYNC_SEL1 clocks in the output of AND gate 312 (=1 by SELECT=1 and SYNC_SEL0=0).

State 0000: Once in state 414 (0000), the system can transition to either state 408, 412, 416, or 414.

If gating element 302a clocks in SELECT=0 and either no clock appears at gating element 302b or 302b also clocks in SELECT=0, the transition is to state 408: CLK0_EN clocks in the output of AND gate 308a (=0 by SYNC_SEL0=0) and SYNC_SEL0 clocks in the output of AND gate 310 (=1 by SELECT=0 and SYNC_SEL1=0). If a clock appears also at gating element 302b, CLK1_EN clocks in the output of AND gate 308b (=0 by SYNC_SEL1=0) and SYNC_SEL1 clocks in the output of AND gate 312 (=0 by SYNC_SEL0=1).

If gating element 302b clocks in SELECT=1 and either no clock appears at gating element 302a or 302a also clocks in SELECT=1, the transition is to state 416: CLK0_EN potentially clocks in the output of AND gate 308a (=0 by SYNC_SEL0=0) and SYNC_SEL0 potentially clocks in the output of AND gate 310 (=0 by SELECT=1). CLK1_EN clocks in the output of AND gate 308b (=0 by SYNC_SEL1=0) and SYNC_SEL1 clocks in the output of AND gate 312 (=1 by SELECT=1 and SYNC_SEL0=0).

If both gating elements are clocked at the same time with 302a clocking in SELECT=0 and 302b clocking in SELECT=1 (0 (that is, the clock edges occur during a 0→1 or a 1→0 transition at SELECT), the transition is to state 412: CLK0_EN clocks in the output of AND gate 308a (=0 by SYNC_SEL0=0) and SYNC_SEL0 clocks in the output of AND gate 310 (=1 by SELECT=0 and SYNC_SEL1=0). CLK1_EN clocks in the output of AND gate 308b (=0 by SYNC_SEL1=0) and SYNC_SEL1 clocks in the output of AND gate 312 (=1 by SELECT=1 and SYNC_SEL0=0).

If gating element 302a clocks in SELECT=1 or gating element 302b clocks in SELECT=0 or both happens at the same time (that is, the clock edges occur during a 0→1 or a 1→0 transition at SELECT), the transition is to state 414: CLK0_EN clocks in the output of AND gate 308a (=0 by SYNC_SEL0=0) and SYNC_SEL0 clocks in the output of AND gate 310 (=0 by SELECT=1). CLK1_EN clocks in the output of AND gate 308b (=0 by SYNC_SEL1=0) and SYNC_SEL1 clocks in the output of AND gate 312 (=0 by SELECT=0).

State 0010: Once in state 416 (0010), the system can transition to either state 418, 420, or 416.

If SELECT=1 is clocked into gating element 302b, the transition is to state 420: If a clock appears also at gating element 302a, CLK0_EN clocks in the output of AND gate 308a (=0 by SYNC_SEL0=0) and SYNC_SEL0 clocks in the output of AND gate 310 (=0 by SYNC_SEL1=1). CLK1_EN clocks in the output of AND gate 308b (=1 by SYNC_SEL1=1 and CLK0_EN=SYNC_SEL0=0) and SYNC_SEL1 clocks in the output of AND gate 312 (=1 by SELECT=1 and SYNC_SEL0=0).

If SELECT=0 is clocked into gating element 302b, the transition is to state 418: If a clock appears also at gating element 302a, CLK0_EN clocks in the output of AND gate 308a (=0 by SYNC_SEL0=0) and SYNC_SEL0 clocks in the output of AND gate 310 (=0 by SYNC_SEL1=1). CLK1_EN clocks in the output of AND gate 308b (=1 by SYNC_SEL1=1 and CLK0_EN=SYNC_SEL0=0) and SYNC_SEL1 clocks in the output of AND gate 312 (=0 by SELECT=0).

If no clock appears at gating element 302b the transition is to state 416: If a clock appears at gating element 302a, CLK0_EN clocks in the output of AND gate 308a (=0 by SYNC_SEL0=0) and SYNC_SEL0 clocks in the output of AND gate 312 (=0 by SYNC_SEL1=1). CLK1_EN and SYNC_SEL1 are not altered since there is no clock.

State 0011: Once in state 420 (0011), the system can transition to either state 420 or 418.

If SELECT=1 is clocked into gating element 302b or no clock occurs at 302b, the transition is to state 420: If a clock appears at gating element 302a, CLK0_EN clocks in the output of AND gate 308a (=0 by SYNC_SEL0=0) and SYNC_SEL0 clocks in the output of AND gate 310 (=0 by SYNC_SEL1 =1). CLK1_EN clocks in the output of AND gate 308b (=1 by SYNC_SEL1=1 and CLK_EN=SYNC_SEL0=0) and SYNC_SEL1 clocks in the output of AND gate 312 (=1 by SELECT=1 and SYNC_SEL0=0).

If SELECT=0 is clocked into gating element 302b, the transition is to state 418: If a clock appears at gating element 302a, CLK0_EN clocks in the output of AND gate 308a (=0 by CLK1_EN=1) and SYNC_SEL0 clocks in the output of AND gate 310 (=0 by SYNC_SEL1=1). CLK1_EN clocks in the output of AND gate 308b (=1 by SYNC_SEL1 and CLK0_EN=SYNC_SEL0=0) and SYNC_SEL1 clocks in the output of AND gate 312 (=0 by SELECT=0).

State 0001: Once in state 418 (0001), the system can transition to either state 416, 410, 414, 412, 408, or 418.

If SELECT=1 is clocked into gating element 302a and 302b or if SELECT=1 is clocked into 302b only and no clock edge appears at 302a, the transition is to state 416: CLK0_EN potentially clocks in the output of AND gate 308a (=0 by SYNC_SEL0=0) and SYNC_SEL0 potentially clocks in the output of AND gate 310 (=0 by SELECT=1). CLK1_EN clocks in the output of AND gate 308b (=0 by SYNC_SEL1=0) and SYNC_SEL1 clocks in the output of AND gate 312 (=1 by SELECT=1 and SYNC_SEL0=0).

If SELECT=0 and a clock appears only at gating element 302a, the transition is to state 410: CLK0_EN clocks in the output of AND gate 308a (=0 by SYNC_SEL0=0). SYNC_SEL0 clocks in the output of AND gate 310 (=1 by SELECT=0 and SYNC_SEL1=0). SYNC_SEL1 and CLK1_EN remain unchanged since there's no clock for gating element 302b.

If SELECT=0 and a clock appears at gating element 302b only, or if both gating elements are clocked with 302a clocking in SELECT=1 and 302b clocking in SELECT=1 (that is, the clock edges occur during a 0→1 or a 1→0 transition at SELECT), the transition is to state 414: CLK0_EN potentially clocks in the output of AND gate 308a (=0 by SYNC_SEL0=0) and SYNC_SEL0 potentially clocks in the output of AND gate 310 (=0 by SELECT=1). CLK1_EN clocks in the output of AND gate 308b (=0 by SYNC_SEL1=0) and SYNC_SEL1 clocks in the output of AND gate 312 (=0 by SELECT=0).

If SELECT=0 and both gating elements are clocked at the same time, the transition is to state 408: CLK0_EN clocks in the output of AND gate 308a (=0 by SYNC_SEL0=0) and SYNC_SEL0 clocks in the output of AND gate 310 (=1 by SELECT=0 and SYNC_SEL1=0). CLK1_EN clocks in the output of AND gate 308b (=0 by SYNC_SEL1=0) and SYNC_SEL1 clocks in the output of AND gate 312 (=0 by SELECT=0).

If both gating elements are clocked at the same time with 302a clocking in SELECT=0 and 302b clocking in SELECT=1 (that is, the clock edges occur during a 0→1 or a 1→0 transition at SELECT), the transition is to state 412: CLK0_EN clocks in the output of AND gate 308a (=0 by SYNC_SEL0=0) and SYNC_SEL0 clocks in the output of AND gate 310 (=1 by SELECT=0 and SYNC_SEL1=0). CLK1_EN clocks in the output of AND gate 308b (=0 by SYNC_SEL1) and SYNC_SEL1 clocks in the output of AND gate 312 (=1 by SELECT=1 and SYNC_SEL0=0).

If SELECT=1 is clocked into gating element 302a and no clock appears at gating element 302b, the transition is to state 418: CLK0_EN clocks in the output of AND gate 308a (=0 by SYNC_SEL0=0) and SYNC_SEL0 clocks in the output of AND gate 310 (=0 by SYNC_SEL1 =1). CLK1_EN and SYNC_SEL1 are not altered since there is no clock.

State 1010: Once in state 412 (1010), the system can transition to either state 414, 416 or 408.

If both gating elements are clocked at the same time, the transition is to state 414 (independent of the value at SELECT): CLK0_EN clocks in the output of AND gate 308a (=0 by SYNC_SEL1 =1) and SYNC_SEL0 clocks in the output of AND gate 310 (=0 by SYNC_SEL1=1). CLK1_EN clocks in the output of AND gate 308b (=0 by SYNC_SEL0=1) and SYNC_SEL1 clocks in the output of AND gate 312 (=0 by SYNC_SEL0=1).

If only gating element 302a is clocked, the transition is to state 416: CLK0_EN clocks in the output of AND gate 308a (=0 by SYNC_SEL1=1) and SYNC_SEL0 clocks in the output of AND gate 310 (=0 by SYNC_SEL1=1). CLK1_EN and SYNC_SEL1 remain unchanged since there's no clock for gating element 302b.

If only gating element 302b is clocked, the transition is to state 408: CLK0_EN and SYNC_SEL0 remain unchanged since there's no clock for gating element 302a. CLK1_EN clocks in the output of AND gate 308b (=0 by SYNC_SEL0=1) and SYNC_SEL1 clocks in the output of AND gate 312 (=0 by SYNC_SEL0=1).

State 1001: Once in state 410 (1001), the system can transition to either state 418, 414, 408, or 410.

If SELECT=1 is clocked into gating element 302a and no clock appears at gating element 302b, the transition is to state 418: CLK0_EN clocks in the output of AND gate 308a (=0 by CLK1_EN=1) and SYNC_SEL0 clocks in the output of AND gate 310 (=0 by SELECT=1). CLK1_EN and SYNC_SEL1 remain unchanged since there's no clock for gating element 302b.

If both gating elements are clocked at the same time with 302a clocking in SELECT=1 the transition is to state 414: CLK0_EN clocks in the output of AND gate 308a (=0 by CLK1_EN=1) and SYNC_SEL0 clocks in the output of AND gate 310 (=0 by SELECT=1). CLK1_EN clocks in the output of AND gate 308b (=0 by SYNC_SEL1=0) and SYNC_SEL1 clocks in the output of AND gate 312 (=0 by SYNC_SEL1=1).

If gating element 302b is clocked and gating element 302a is either not clocked or clocks in SELECT=0, the transition is to 408: CLK0_EN potentially clocks in the output of AND gate 308a (=0 by CLK1_EN=1) and SYNC_SEL0 potentially clocks in the output of AND gate 310 (=1 by SELECT=0 and SYNC_SEL1=0). CLK1_EN clocks in the output of AND gate 308b (=0 by SYNC_SEL1=0) and SYNC_SEL1 clocks in the output of AND gate 312 (=0 by SYNC_SEL0=1).

If SELECT=0 is clocked into gating element 302a and no clock appears at gating element 302b, the transition is to state 410: CLK0_EN clocks in the output of AND gate 308a (=0 by CLK1_EN=1) and SYNC_SEL1 clocks in the output of AND gate 310 (=1 by SELECT=0 and SYNC_SEL1=0). CLK1_EN and SYNC_SEL1 are not altered since there is no clock.

State 1000: Once in state 408 (1000), the system can transition to either state 402, 404, or 408.

If gating element 302a clocks in SELECT=0, the transition is to state 402: CLK0_EN clocks in the output of AND gate 308a (=1 by SYNC_SEL0=0 and CLK1_EN= SYNC_SEL1=0) and SYNC_SEL0 clocks in the output of AND gate 310 (=1 by SELECT=0 and SYNC_SEL1=0).). If a clock appears also at gating element 302b, CLK1_EN clocks in the output of AND gate 308b (=0 by CLK0_EN= 1) and SYNC_SEL1 clocks in the output of AND gate 312 (=0 by SYNC_SEL0=1).

If gating element 302a clocks in SELECT=1, the transition is to state 402: CLK0_EN clocks in the output of AND gate 308a (=1 by SYNC_SEL0=0 and CLK1_EN= SYNC_SEL1=0) and SYNC_SEL0 clocks in the output of AND gate 310 (=0 by SELECT=1). If a clock appears also at gating element 302b, CLK1_EN clocks in the output of AND gate 308b (=0 by SYNC_SEL1=0) and SYNC_SEL1 clocks in the output of AND gate 312 (=0 by SYNC_SEL0= 1).

If no clock appears at gating element 302a the transition is to state 408: CLK0_EN and SYNC_SEL0 are not altered since there is no clock. If a clock appears at gating element 302b, CLK1_EN clocks in the output of AND gate 308b (=0 by SYNC_SEL1=0) and SYNC_SEL1 clocks in the output of AND gate 310 (=0 by SYNC SEL0=1).

The invention described in the above detailed description is not intended to be limited to the specific form set forth herein, but is intended to cover such alternatives, modifications and equivalents as can reasonably be included within the spirit and scope of the appended claims.

What is claimed is:

1. A clock multiplexer, comprising:
   a plurality of cross coupled multiple stage gating elements, each gating element including a plurality of flip flops;
   a coupling circuit for cross coupling the gating elements, the coupling circuit adapted to indicate a select signal seen by each of said plurality of gating elements on a next clock transition, said coupling circuit receiving as inputs outputs from a plurality of said flip flops; and
   an output logic coupled to each of the plurality of multiple stage gating elements to generate an output clock signal.

2. A clock multiplexer in accordance with claim 1, said coupling circuit comprising NOR gates receiving as inputs the outputs of a plurality of said gating elements' plurality of flip flops, outputs of said NOR gates being used to control inputs of at least one of said plurality of said flip flops of an other of said gating elements.

3. A clock multiplexer in accordance with claim 2, outputs of said NOR gates being provided to inputs to AND gates, another input to said AND gates being the output from a previous one of said plurality of flip flops.

4. A clock multiplexer, comprising:
- a first gating element including a first flip flop and a second flip flop with an input coupled to an output of the first flip flop;
- a second gating element including a third flip-flop and a fourth flip flop with an input coupled to an output of the third flip flop; and
- a cross coupling circuit coupling said first and second gating elements by coupling an output of said first flip flop to an input of said fourth flip flop and coupling an output of said third flip flop to an input of said second flip flop; and
- an output logic coupled to the first and second gating elements to generate an output clock signal.

5. A clock multiplexer, comprising:
- a first gating element having a pair of cascaded flip flops;
- a second gating element having a pair of cascaded flip flops cross coupled to said first gating element;
- a cross coupling circuit coupling said first and second gating elements, said cross coupling circuit comprising a first OR gate adapted to receive as inputs outputs of said cascaded flip flops of said first gating element and a second OR gate adapted to receive as inputs outputs of said cascaded flip flops of said second gating element; and
- an output logic coupled to the first and second gating elements to generate an output clock signal.

6. A clock multiplexer according to claim 5, an output of said first OR gate defining an input to first gate, another input to said first gate being an output from a first of said cascaded flip flops of said second gating element, an output of said first gate defining an input to a second of said cascaded flip flops of said second gating element.

7. A clock multiplexer according to claim 6, an output of said second OR gate defining an input to a second gate, another input to said second gate being an output from a first of said cascaded flip flops of said first gating element, an output of said second gate defining an input to a second of said cascaded flip flops of said first gating element.

8. A clock multiplexer in accordance with claim 1, said coupling circuit comprising OR gates receiving as inputs the outputs of a plurality of said gating elements' plurality of flip flops, outputs of said OR gates being used to control inputs of at least one of said plurality of said flip flops of an other of said gating elements.

9. A clock multiplexer in accordance with claim 8, outputs of said OR gates being provided to inputs to AND gates, another input to said AND gates being the output from a previous one of said plurality of flip flops.

10. A clock multiplexer in accordance with claim 3, said NOR gates comprising OR gates having inverted outputs applied at inputs of said AND gates.

11. A clock multiplexer in accordance with claim 4, the cross coupling circuit further coupling the output of the second flip flop to the input of the fourth flip flop and coupling the output of the fourth flip flop to the input of the second flip flop.

12. A clock multiplexer in accordance with claim 11, the cross coupling circuit comprising a first gate and a second gate, the outputs of the first and second flip flops coupled to inputs to the first gate, the outputs of the third and fourth flip flops coupled to inputs to the second gate, an output of the first gate coupled to the input of the fourth flip flop, an output of the second gate coupled to the input of the second flip flop.

13. A clock multiplexer in accordance with claim 12, the cross coupling circuit comprising a third gate and a fourth gate, the outputs of the first flip flop and second gate coupled to inputs to the third gate, the outputs of the third flip flop and first gate coupled to inputs to the fourth gate, an output of the third gate coupled to the input of the third flip flop, an output of the fourth gate coupled to the input of the fourth flip flop.

14. A clock multiplexer in accordance with claim 4, the cross coupling circuit comprising a first gate and a second gate, the outputs of the first flip flop and the third flip flop coupled to inputs to the first gate, the outputs of the third flip flop and the first flip flop coupled to inputs to the second gate, an output of the first gate coupled to the input of the second flip flop, an output of the second gate coupled to the input of the fourth flip flop.

15. A clock multiplexer comprising:
- a first gating element including a first flip flop and a second flip flop with an input coupled to an output of the first flip flop;
- a second gating element including a third flip-flop and a fourth flip flop with an input coupled to an output of the third flip flop;
- a cross coupling circuit coupling said first and second gating elements by coupling an output of said second flip flop to an input of said fourth flip flop and coupling an output of said fourth flip flop to an input of said second flip flop, the cross coupling circuit further coupling the output of the first flip flop to the input of the fourth flip flop and coupling the output of the third flip flop to the input of the second flip flop; and
- an output logic coupled to the first and second gating elements to generate an output clock signal.

16. A clock multiplexer in accordance with claim 15, the cross coupling circuit comprising a first gate and a second gate, the outputs of the first and second flip flops coupled to inputs to the first gate, the outputs of the third and fourth flip flops coupled to inputs to the second gate, an output of the first gate coupled to the input of the fourth flip flop, an output of the second gate coupled to the input of the second flip flop.

17. A clock multiplexer in accordance with claim 16, the cross coupling circuit comprising a third gate and a fourth gate, the outputs of the first flip flop and second gate coupled to inputs to the third gate, the outputs of the third flip flop and first gate coupled to inputs to the fourth gate, an output of the third gate coupled to the input of the third flip flop, an output of the fourth gate coupled to the input of the fourth flip flop.

18. A clock multiplexer comprising:
- a first gating element including a first flip flop and a second flip flop with an input coupled to an output of the first flip flop;
- a second gating element including a third flip-flop and a fourth flip flop with an input coupled to an output of the third flip flop;
- a cross coupling circuit coupling said first and second gating elements by coupling an output of said second flip flop to an input of said fourth flip flop and coupling an output of said fourth flip flop to an input of said second flip flop, wherein the cross coupling circuit comprises a first gate and a second gate, the outputs of the first flip flop and the fourth flip flop coupled to inputs to the first gate, the outputs of the third flip flop and the second flip flop coupled to inputs to the second gate, an output of the first gate coupled to the input of the second flip flop, an output of the second gate coupled to the input of the fourth flip flop; and an output logic coupled to the first and second gating elements to generate an output clock signal.

19. A clock multiplexer in accordance with claim 1, wherein the output logic is an OR gate.

20. A clock multiplexer in accordance with claim 4, wherein the output logic is an OR gate.

21. A clock multiplexer in accordance with claim 5, wherein the output logic is an OR gate.

22. A clock multiplexer in accordance with claim 15, wherein the output logic element is an OR gate.

* * * * *